United States Patent
Lee et al.

(10) Patent No.: US 7,626,331 B2
(45) Date of Patent: Dec. 1, 2009

(54) ACTIVE MATRIX ORGANIC LIGHT EMITTING DEVICE HAVING ORGANIC THIN FILM TRANSISTOR DISPOSED ON ORGANIC LIGHT EMITTING DIODE STRUCTURE

(75) Inventors: Ho-nyeon Lee, Seongnam-si (KR); Sung-kee Kang, Seongnam-si (KR); Tae-sik Oh, Suwon-si (KR); In-seo Kee, Seongnam-si (KR); Seong-eui Lee, Seongnam-si (KR); Jung-woo Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 359 days.

(21) Appl. No.: 11/405,766

(22) Filed: Apr. 18, 2006

(65) Prior Publication Data
US 2006/0238115 A1 Oct. 26, 2006

(30) Foreign Application Priority Data
Apr. 21, 2005 (KR) .................. 10-2005-0033199

(51) Int. Cl.
*H01J 1/62* (2006.01)
*H01J 63/04* (2006.01)

(52) U.S. Cl. .................. 313/504; 313/506; 313/509
(58) Field of Classification Search ............ 313/498–512
See application file for complete search history.

(56) References Cited

U.S. PATENT DOCUMENTS

| 6,538,390 | B2 | 3/2003 | Fujita et al. ............... 315/169.3 |
| 6,784,032 | B2 | 8/2004 | Lee et al. .................... 438/149 |
| 2002/0047567 | A1* | 4/2002 | Fujita et al. ............. 315/169.3 |
| 2004/0169460 | A1* | 9/2004 | Chang et al. ................ 313/498 |
| 2004/0242115 | A1* | 12/2004 | Yanagawa .................... 445/25 |
| 2005/0046342 | A1* | 3/2005 | Park et al. ................... 313/504 |
| 2005/0194896 | A1* | 9/2005 | Sugita et al. ................ 313/506 |
| 2005/0242348 | A1* | 11/2005 | Oh .............................. 257/59 |
| 2006/0138418 | A1* | 6/2006 | Lee et al. ..................... 257/59 |

* cited by examiner

*Primary Examiner*—Bumsuk Won
(74) *Attorney, Agent, or Firm*—Cantor Colburn, LLP (57) ABSTRACT

A bottom-surface emitting organic light emitting device and a method of manufacturing the organic light emitting device includes providing a transparent substrate, an organic light emitting diode ("OLED") that includes a transparent electrode, an organic light emitting layer, and a pixel electrode sequentially stacked on an upper surface of the transparent substrate, a planarization film covering the OLED, and a pixel circuit that drives the OLED using an organic thin film transistor ("OTFT") located on the planarization film.

14 Claims, 5 Drawing Sheets

ACTIVE MATRIX ORGANIC LIGHT EMITTING DEVICE HAVING ORGANIC THIN FILM TRANSISTOR DISPOSED ON ORGANIC LIGHT EMITTING DIODE STRUCTURE

This application claims priority to Korean Patent Application No. 10-2005-0033199, filed on Apr. 21, 2005 and all the benefits accruing therefrom under 35 U.S.C. §119, and the contents of which in its entirety are herein incorporated by reference.

BACKGROUND OF THE INVENTION

1. Field of the Invention

The present invention relates to an organic light emitting device that uses an organic light emitting diode ("OLED") and a method of manufacturing the device, and more particularly, to an active matrix organic light emitting device having a pixel circuit that drives the OLED using an organic thin film transistor in each pixel and a method of manufacturing the device.

2. Description of the Related Art

An organic light emitting diode ("OLED") is a light emitting device that generates light using an organic electroluminescence phenomenon, where light having a particular wavelength is generated by energy of excitons formed by recombining electrons injected from a cathode and holes injected from an anode, in a low molecular weight organic thin film or a polymer organic thin film.

Display devices that use the OLED can be divided into passive matrix ("PM") types and active matrix ("AM") types according to the driving method. The AM type organic light emitting device includes a pixel circuit that drives each pixel, arranged in a matrix with the pixels. The pixel circuit is switched by a thin film transistor ("TFT"), and stores pixel related information. The AM type has the advantages of superior contrast, less image flickering, and quicker response time over the PM type, since the AM type can be driven at a higher speed than the PM type.

Figure 1:
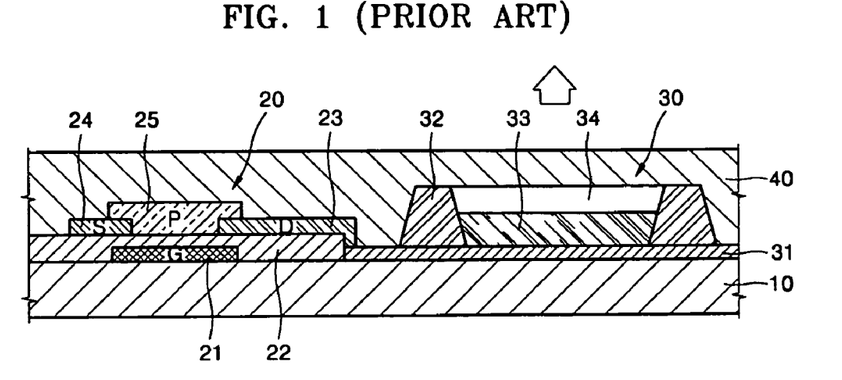
FIG. 1 is a cross-sectional view illustrating a conventional active matrix type organic light emitting device.

FIG. 1 is a cross-sectional view illustrating a conventional AM type organic light emitting device. To facilitate understanding of the structure, the cross-section of a unit pixel that includes a switching TFT and an OLED is depicted. In FIG. 1, a TFT 20 structure is included on one side of a substrate 10, and an OLED 30 structure is included adjacent to the TFT 20 structure on the substrate 10. This type of structure is employed by an organic light emitting device disclosed in U.S. Pat. No. 6,784,032. The TFT 20 structure includes a gate electrode 21, a gate insulating layer 22, a source electrode 24, a drain electrode 23, and a semiconductor unit 25. The OLED 30 structure includes a pixel electrode 31 connected to the drain electrode 23, a bank unit 32 that defines a light emission region, and an organic light emitting layer 33 and a transparent electrode 34 sequentially stacked in the light emission region. A protection film 40 is also employed.

The conventional AM organic light emitting device has a simple structure and is easy to manufacture, but has a low aperture ratio, which is the ratio of the area occupied by a light emission region with respect to the unit pixel area.

Figure 2:
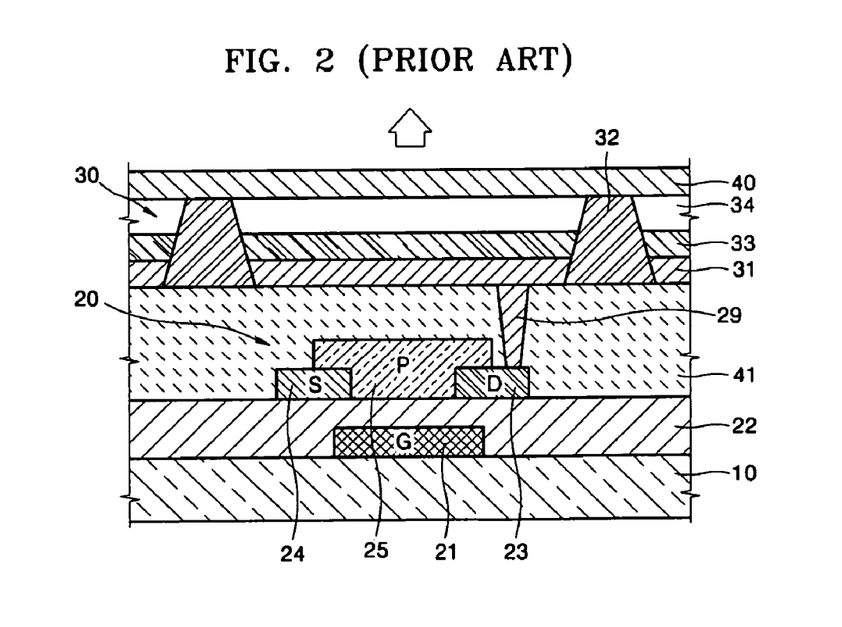
FIG. 2 is a cross-sectional view illustrating a conventional top-surface emitting organic light emitting device.

FIG. 2 is a cross-sectional view illustrating a conventional top-surface emitting organic light emitting device. In FIG. 2, to facilitate understanding of the structure, the cross-section of a unit pixel that includes a switching TFT and an OLED is depicted. In FIG. 2, a TFT 20 structure is included on a substrate 10, and an OLED 30 structure is located on the TFT 20 structure. An organic light emitting device having this type of structure is disclosed in U.S. Pat. No. 6,538,390. A planarization film 41 is interposed between the TFT 20 structure and the OLED 30 structure, and the drain electrode 23 of the TFT 20 structure is connected to the pixel electrode 31 of the OLED 30 structure through an interlayer connection unit 29. A protection film 40 is also employed.

The conventional top-surface emitting organic light emitting device has a structurally high aperture ratio, because most of the pixel region can be used as the light emission region. However, the organic light emitting device has a high possibility of contamination with moisture, water vapor, and oxygen from the air, since the organic light emitting device is close to the external air. Thus, the protection film 40 must be provided with a sufficient thickness, thus increasing a thickness and overall size of the device.

Also, when an organic thin film transistor ("OTFT") is used as the TFT 20 structure in the top-surface emitting organic light emitting device, the OTFT may be degraded during the process for forming the OLED 30, since the process temperature of the OLED 30 is higher than the process temperature of the OTFT.

BRIEF SUMMARY OF THE INVENTION

The present invention provides a bottom-surface light emitting organic light emitting device having a high aperture ratio and a structure that reduces the degradation of an organic light emitting diode ("OLED") by external air by forming the OLED on an upper surface of a substrate, and a pixel circuit that includes an OTFT located on the OLED, overlapping with the OLED.

The present invention also provides a bottom-surface emitting organic light emitting device that prevents devices from degradation during manufacture by forming an OLED, which has a higher process temperature than an OTFT, on a substrate before forming the OTFT.

According to exemplary embodiments of the present invention, a bottom-surface emitting organic light emitting device includes a transparent substrate, an OLED that includes a transparent electrode, an organic light emitting layer, and a pixel electrode sequentially stacked on the upper surface of the transparent substrate, a planarization film covering the OLED; and a pixel circuit that drives the OLED using an OTFT disposed on the planarization film.

According to exemplary embodiments of the present invention, a method of manufacturing a bottom-surface emitting organic light emitting device includes forming an OLED by sequentially stacking a transparent electrode, an organic light emitting layer, and a pixel electrode on an upper surface of a transparent substrate, forming a planarization film covering the OLED, forming a gate electrode on the upper surface of the planarization film and forming a gate insulating layer covering the gate electrode, forming a hole by removing a part of the gate insulating layer and the planarization film until the pixel electrode of the OLED is exposed, connecting the pixel electrode to a drain electrode through the hole while forming a source electrode and the drain electrode on the gate insulating layer, and forming an organic semiconductor unit between the source electrode and the drain electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Figure 3:
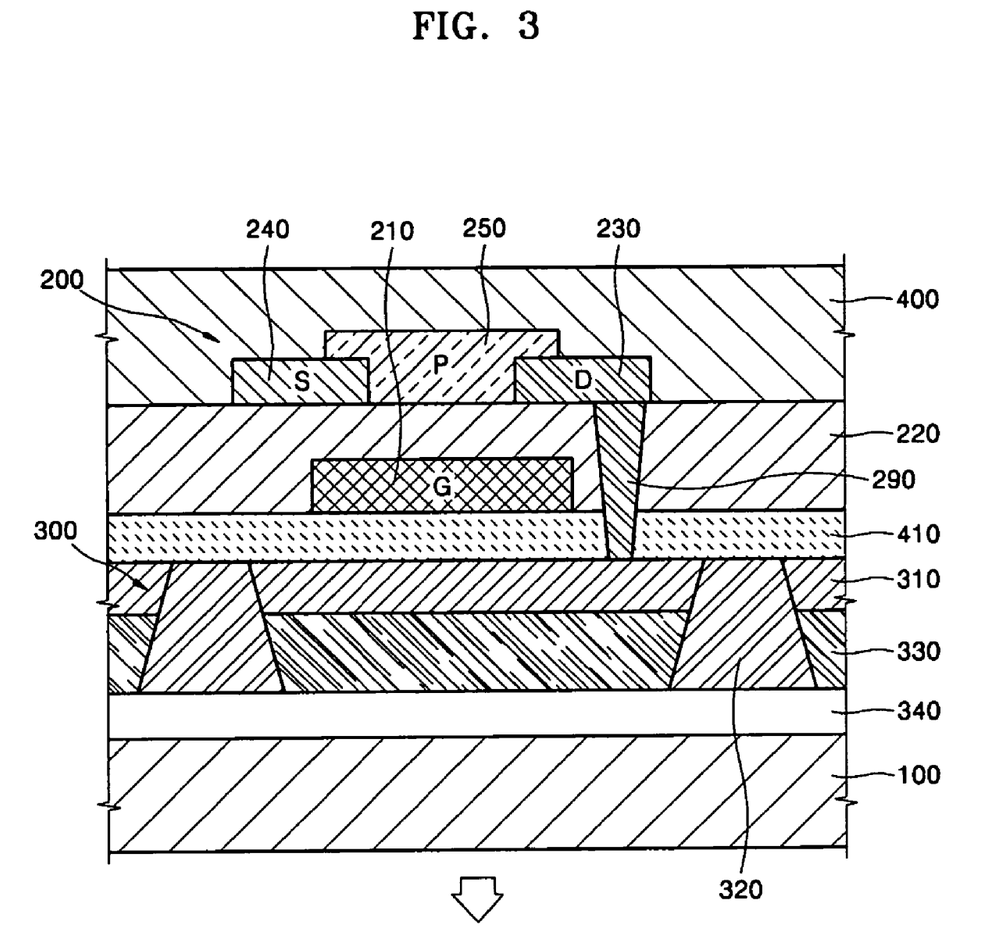
FIG. 3 is a cross-sectional view illustrating an exemplary embodiment of a bottom-surface light emitting organic light emitting device according to the present invention.

Hereinafter, the present invention will be described in detail with reference to the accompanying drawings. FIG. 3 is a cross-sectional view illustrating an exemplary embodiment of a bottom-surface light emitting organic light emitting device according to the present invention. In FIG. 3, to facilitate understanding of the structure, the cross-section of a unit pixel that includes a switching TFT and an OLED is depicted.

The organic light emitting device of FIG. 3 includes a transparent substrate 100, an OLED 300 structure located on the transparent substrate 100, and an OTFT 200 structure formed on a planarization film 410 that covers the OLED 300 structure. An aspect of this device is that light is emitted through the transparent substrate 100, as indicated by the arrow in FIG. 3. The transparent substrate 100 can be a transparent glass substrate or a plastic substrate.

A bottom-surface emitting OLED 300 structure is located on an upper part of the transparent substrate 100. That is, a transparent electrode 340 is located on the transparent substrate 100, and a bank unit 320 that defines a light emission region of a pixel in a barrier film shape is located on the transparent electrode 340. In other words, the transparent substrate 100 includes a first surface and a second surface, where each surface may be substantially planar and parallel to each other. The first surface supports the transparent electrode 340 thereon, and the second surface is a light-emitting surface. A stack of an organic light emitting layer 330 and a pixel electrode 310 is located in the light emission region of the bank unit 320. The transparent electrode 340 may be formed of a transparent conductive material, such as, but not limited to, indium tin oxide ("ITO"). The transparent electrode 340 can be a common electrode formed on the entire upper surface, or substantially the entire first surface, of the transparent substrate 100. The pixel electrode 310 may be formed of a material having high reflectance with respect to light emitted from the organic light emitting layer 330, thus increasing an amount of light exiting the second surface of the transparent substrate 100.

The organic light emitting layer 330 includes at least one emitting layer ("EML"). The EML is not limited to a monolayer structure, but can be a multilayer structure that increases the light emission efficiency by further selectively including an electron transfer layer ("ETL"), a hole transfer layer ("HTL"), and a hole injection layer ("HIL") between two electrodes facing each other. For example, when the organic light emitting layer 330 has a stacked structure (not shown) composed of the ETL, the EML, and the HTL, the ETL can be included between the transparent electrode 340, which is a cathode, and the EML, and the HTL can be included between the pixel electrode 310, which is an anode, and the EML, thus sandwiching the EML between the HTL and the ETL. Here, the electrodes including the EML can be formed of any material known in the art, and the present invention is not limited by the selection of materials.

The OLED 300 structure is covered by an insulating planarization film 410, and the OTFT 200 structure is located on the planarization film 410. The OTFT 200 structure includes a gate electrode 210, a gate insulating layer 220, a source electrode 240, a drain electrode 230, and an organic semiconductor unit 250. This can be a conventional OTFT structure from the prior art. However, an interlayer connection unit 290 that electrically connects the drain electrode 230 of the OTFT 200 to the pixel electrode 310 of the OLED 300 passes through a part of the planarization film 410 and the gate insulating layer 220, within an opening formed through the planarization film 410 and the gate insulating layer 220.

While the gate electrode 210 is shown formed on the planarization film 410, in an alternative embodiment, the source electrode 240, the drain electrode 230, and the interconnecting organic semiconductor unit 250 may be formed on the planarization film 410 and covered by a gate insulating layer 220 with the gate electrode 210 formed on the gate insulating layer 220. In such an embodiment, a protection film 400 may then cover the gate electrode 210 and exposed portions of the gate insulating layer 220.

The OTFT 200 structure partly or entirely overlaps with the light emission region of the OLED 300 structure. Accordingly, the organic light emitting device according to the present embodiment can have a very high aperture ratio, since the light emission region occupies the entire surface except for locations occupied by the bank unit 320.

Also, the organic light emitting device according to the present embodiment can include a protection film 400 on the upper surface of the OTFT 200 structure. The protection film 400 protects the organic materials from contact with moisture and oxygen in the air. In particular, the protection film 400 may overlie the drain electrode 230, the source electrode 240, the organic semiconductor unit 250, and exposed portions of the gate insulating layer 220, as illustrated in FIG. 3.

In the OLED structure according to the present invention, the organic light emitting layer 330 and the transparent electrode 340 are located against the transparent substrate 100, and the organic semiconductor unit 250, which has a higher resistance to moisture and oxygen than the organic light emitting layer 330, is located against the protection film 400. Therefore, the OLED 300 structure according to the present invention is more resistant to moisture and oxygen than a conventional top-surface emitting OLED structure.

The OLED 300 is driven by a pixel circuit that includes the OTFT 200 structure located on an upper part of the OLED 300 structure. As well as the drive OTFT, the pixel circuit is also composed of other elements, such as a switching OTFT, a driving OTFT, a storage capacitor structure, and a line pattern that connects the switching OTFT, the driving OTFT and to the storage capacitor structure.

FIGS. 4A through 4E are cross-sectional views illustrating an exemplary method of manufacturing an exemplary embodiment of an organic light emitting device according to the present invention.

Figure 4A:
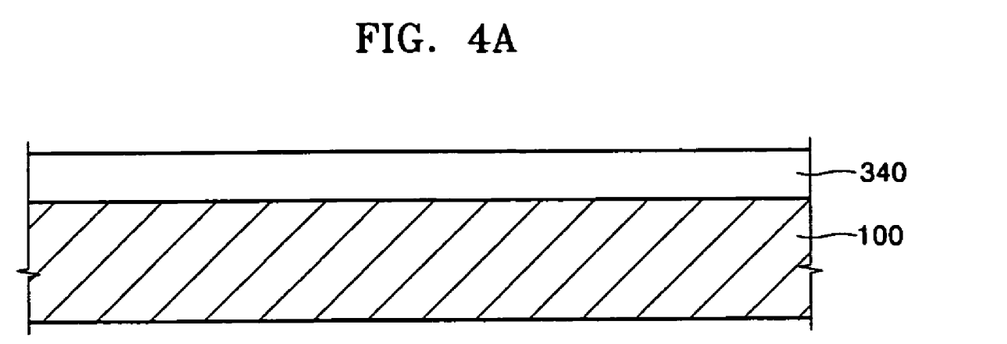
FIGS. 4A through 4E are cross-sectional views illustrating an exemplary method of manufacturing an exemplary embodiment of an organic light emitting device according to the present invention.

Referring to FIG. 4A, a transparent substrate 100 is prepared, including a first surface and a second surface. The second surface is the limit emitting surface of the organic light emitting device. A transparent electrode 340 is formed on the upper surface, such as the first surface, of the transparent substrate 100. The transparent electrode 340 can typically be formed by vacuum evaporation or sputtering, but the material and method are not limited thereto. At this time, the transparent electrode 340 may be deposited on the entire first surface, or at least substantially the entire first surface, of the transparent substrate 100 with a uniform thickness. The transparent electrode 340 can be formed in an ITO monolayer film. Alternatively, the transparent electrode 340 may also be formed in a multilayer film together with a very thin metal film to provide an appropriate work function.

Figure 4B:
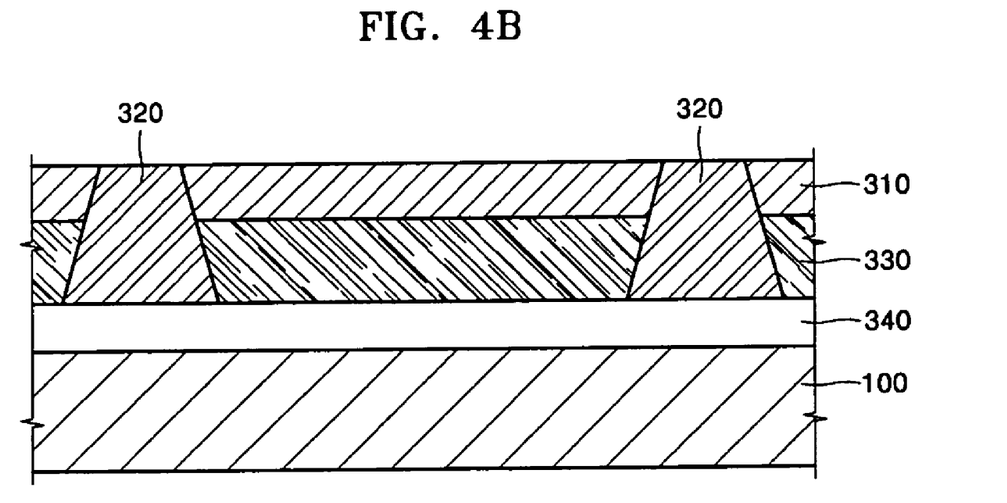

Referring to FIG. 4B, a light emission region of an OLED is defined after forming a bank unit 320 in a vertical barrier shape around the rim of a unit pixel region. Next, an organic light emitting layer 330 and a pixel electrode 310 are sequentially formed in the light emission region, such that the organic light emitting layer 330 is disposed between the pixel electrode 310 and the transparent electrode 340. The organic light emitting layer 330, as described above, can be formed in either a monolayer structure having one EML, or a multiple layer structure. The organic light emitting layer 330 can be formed by a conventional method known in the art. For example, after plasma treating the surface of the transparent electrode 340, a material for forming the organic light emitting layer 330 may be coated on the plasma treated surface of the transparent electrode 340 using an inkjet printing method. The light emitting layer 330 is then formed by curing the resultant product in a furnace or on a hot plate. The pixel electrode 310 can be formed by coating a metal ink on the organic light emitting layer 330 using an inkjet printing method and curing the metal ink. Thus, a bottom-surface emitting organic light emitting diode, i.e., an OLED 300 structure on the transparent substrate 100, is completed.

Figure 4C:
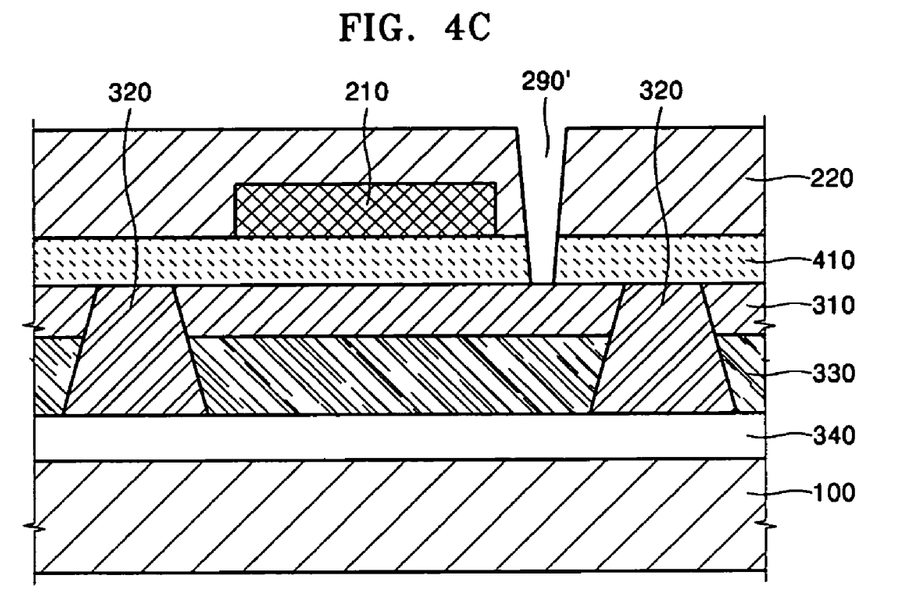

Next, as shown in FIG. 4C, a planarization film 410 is formed on the OLED 300 structure. The planarization film 410 can be formed of an organic insulating material using a spin coating method. After planarizing the upper surface of the OLED 300 structure with the planarization film 410, a pixel circuit that includes at least one OTFT 200 is formed on the planarized upper surface of the OLED 300 structure. Typically, the pixel circuit of an AM type organic light emitting device includes a switching OTFT, a drive OTFT, a storage capacitor, and a line pattern that connects the switching OTFT, the drive OTFT, and the storage capacitor. The capacitor or the line pattern can be formed simultaneously with a gate, a source, and a drain of the OTFT structure.

With further reference to FIG. 4C, a gate electrode 210 is formed on the planarization film 410, and a gate insulating layer 220 is formed covering the gate electrode 210 and the planarization film 410. Then, a hole 290', alternatively termed a via hole, is formed through the gate insulating layer 220 and the planarization film 410 to expose the pixel electrode 310. When the hole 290' is formed using an etching method, a resist film is formed on the upper surface of the gate insulating layer 220 and the region for forming the via hole is patterned using a photolithography method. Afterward, the patterned region is etched using dry etching or wet etching. The hole 290' is then formed by removing the resist film. Alternatively, the hole 290' can be formed by removing a desired part of the gate insulating layer 220 and the planarization film 410 by using a laser beam.

Figure 4D:
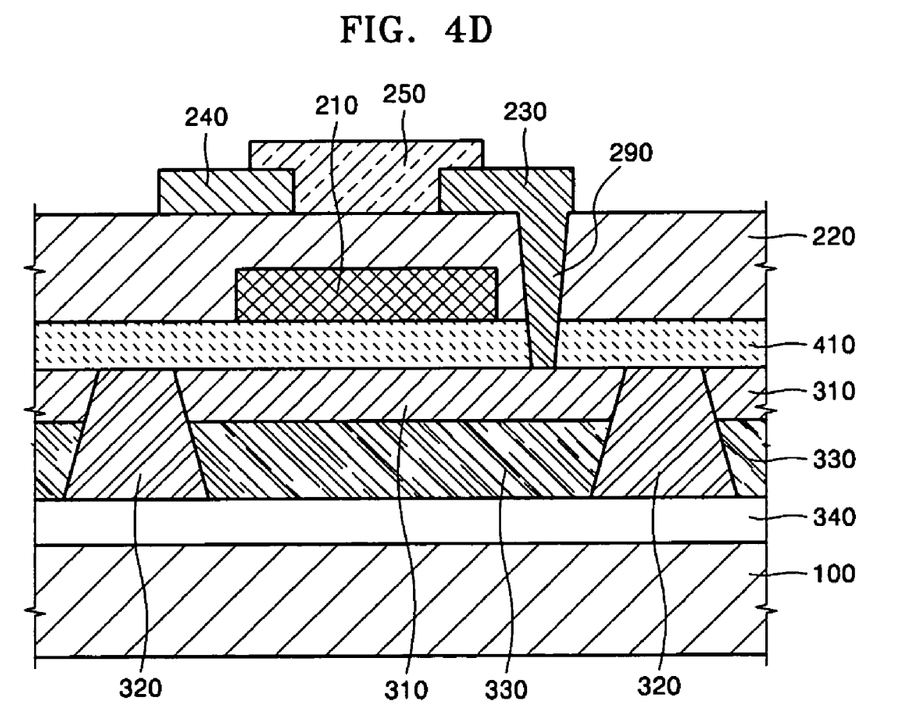

Referring to FIG. 4D, a source electrode 240 and a drain electrode 230 in the OTFT structure are formed on the gate insulating layer 220. The drain electrode 230 may be formed overlapping the hole 290'. At this time, an interlayer connection unit 290 is formed by filling the hole 290' with a conductive material, before or at the same time as forming the drain electrode 230. The source and drain electrodes 240 and 230 may be patterned by an inkjet printing method using a metal ink. Also, prior to patterning the source and drain electrodes 240 and 230, a process for forming a surface control layer on the gate insulating layer 220 and a process for surface energy patterning of the surface control layer using laser can further be included. Next, an organic semiconductor unit 250 is formed between the source electrode 240 and the drain electrode 230. The organic semiconductor unit 250 can also be formed by an inkjet printing method. The patterning by inkjet printing method is accompanied with a curing process.

The organic semiconductor unit 250 may be cured at a lower temperature than the organic light emitting layer 330 which is cured in the process of forming the OLED 300 structure. The curing temperature may vary according to the organic material coated, but, in general, organic semiconductor materials can be cured at relatively low temperatures. Therefore, the OLED 300 structure which is formed prior to the OTFT 200 structure can be maintained without deformation or degradation while the organic semiconductor unit 250 is cured.

In the aforementioned method of manufacturing the organic light emitting device, the electrodes are patterned using an inkjet printing method. However, the inkjet printing method is more suited to manufacturing large display devices having relatively low precision. To manufacture small high resolution display devices that require high precision, an etching process including photolithography may be advantageous.

Figure 4E:
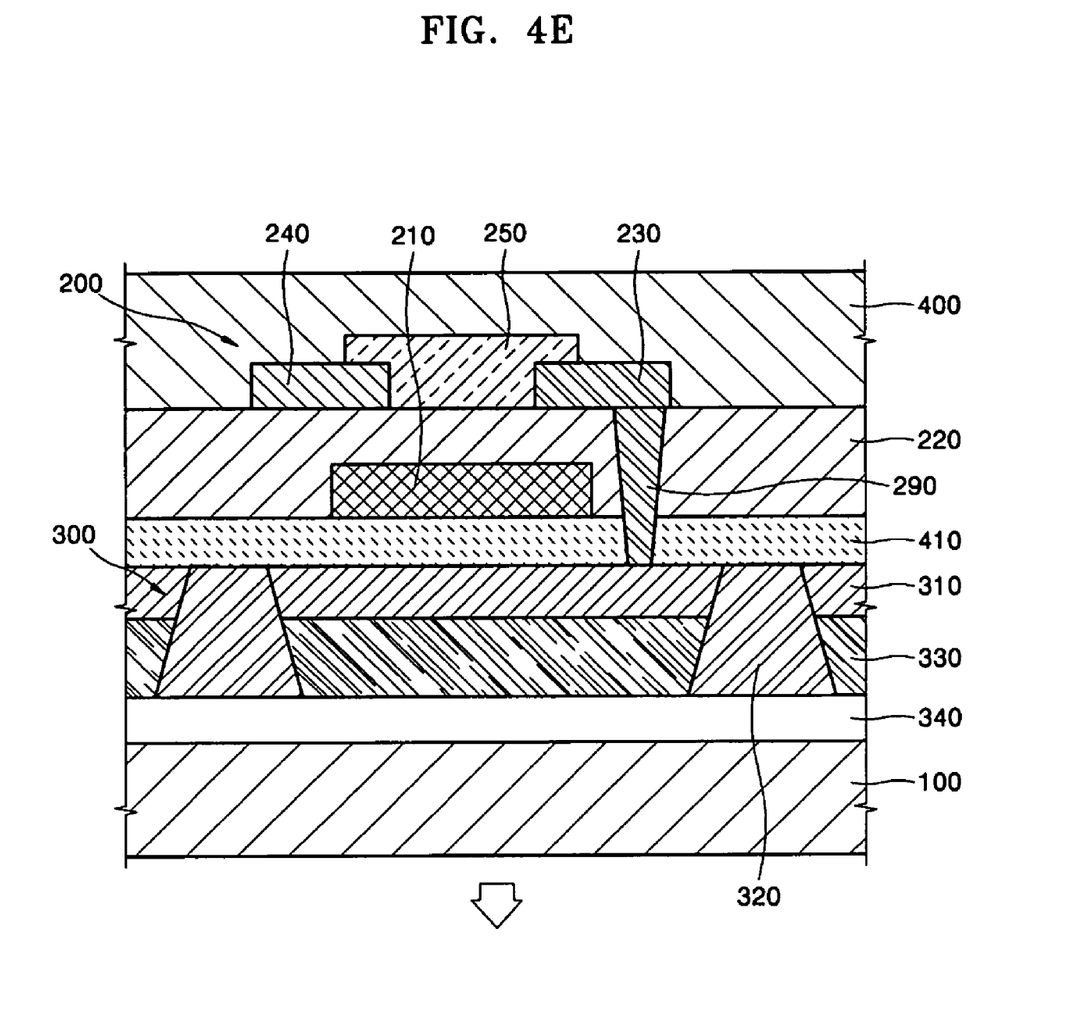

As shown in FIG. 4E, a protection film 400 can be formed on the completely formed OTFT 200 structure to protect the inner structure of the display device from moisture and oxygen in the air. In particular, the protection film 400 is formed over the drain electrode 230, the source electrode 240, the organic semiconductor unit 250, and exposed portions of the gate insulating layer 220. However, since the OTFT 200 structure has a higher resistance to moisture and oxygen than the OLED 300, the protection film 400 can be thinner than the protection film 40 of the conventional display device (see FIG. 2) in which the OLED 30 structure is located on the upper side of the display device.

In the above descriptions, the term 'organic light emitting device' denotes all devices having driving circuits that drive an organic light emitting diode having an OLED and an OTFT.

The bottom-surface emitting organic light emitting device according to the present invention has a high aperture ratio. An OTFT serves to protect an OLED, since the OTFT has relatively higher resistance to moisture, water vapor, and oxygen.

The method of manufacturing the bottom-surface emitting organic light emitting device according to the present invention also has the effect of stabilizing the process from a process temperature point of view. That is, the OTFT is not degraded during the process for forming the OLED, since the OTFT is formed subsequent to forming the OLED.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A bottom-surface emitting organic light emitting device comprising:
    a transparent substrate;
    an organic light emitting diode structure including a transparent electrode, an organic light emitting layer, and a pixel electrode sequentially stacked on an upper surface of the transparent substrate;
    a planarization film covering and planarizing the organic light emitting diode structure and having a planarized upper surface; and
    a pixel circuit driving the organic light emitting diode using an organic thin film transistor disposed on the planarized upper surface of the planarization film.

2. The organic light emitting device of claim 1, wherein light is emitted through a bottom surface of the transparent substrate, the bottom surface opposite the upper surface.

3. The organic light emitting device of claim 1, wherein a drain electrode of the organic thin film transistor is connected to the pixel electrode of the organic light emitting diode via an interlayer connection unit formed by filling a conductive material in a hole passing through the planarization film.

4. The organic light emitting device of claim 3, wherein the hole further passes through a gate insulating layer of the organic thin film transistor.

5. The organic light emitting device of claim 1, wherein the pixel electrode is a metal electrode.

6. The organic light emitting device of claim 1, wherein the organic light emitting diode comprises a bank unit defining a light emission region and formed vertically on the transparent electrode.

7. The organic light emitting device of claim 1, wherein the transparent electrode is uninterrupted by a bank unit of the organic light emitting diode, and the transparent electrode is formed on at least substantially an entire surface of the transparent substrate.

8. The organic light emitting device of claim 1, wherein at least a part of the pixel circuit overlaps with a light emission region of the organic light emitting diode.

9. The organic light emitting device of claim 1, wherein the transparent electrode of the organic light emitting diode is formed in one body with the entire surface of the transparent substrate.

10. The organic light emitting device of claim 1, further comprising a protection film preventing the pixel circuit from contacting external air by covering an upper surface of the pixel circuit.

11. The organic light emitting device of claim 1, wherein the pixel circuit includes a gate electrode formed on the planarized upper surface of the planarization film, a gate insulating layer covering the gate electrode, a drain electrode and a source electrode formed on the gate insulating layer in spaced locations, and an organic semiconductor unit positioned between the source electrode and the drain electrode.

12. The organic light emitting device of claim 11, further comprising a protection film covering the drain electrode, the source electrode, the organic semiconductor unit, and exposed portions of the gate insulating layer.

13. The organic light emitting device of claim 11, wherein the drain electrode is electrically connected to the pixel electrode.

14. An active matrix organic light emitting device comprising:

a transparent substrate;

an organic light emitting diode structure including a transparent electrode, an organic light emitting layer, and a pixel electrode sequentially stacked on the transparent substrate;

a planarization film covering and planarizing the organic light emitting diode structure and having a planarized upper surface; and a pixel circuit driving the organic light emitting diode and including an organic thin film transistor located on the planarized upper surface of the planarization film, wherein a drain electrode of the organic thin film transistor is connected to the pixel electrode of the organic light emitting diode through a hole formed through the planarization film.

* * * * *